US010606324B2

(12) United States Patent
Leigh et al.

(10) Patent No.: US 10,606,324 B2
(45) Date of Patent: Mar. 31, 2020

(54) PLENUM TO DELIVER COOL AIR AND ROUTE MULTIPLE CABLES

(71) Applicant: Hewlett Packard Enterprise Development LP, Houston, TX (US)

(72) Inventors: Kevin B. Leigh, Houston, TX (US); George D. Megason, Spring, TX (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/543,654

(22) PCT Filed: Jan. 16, 2015

(86) PCT No.: PCT/US2015/011763
§ 371 (c)(1),
(2) Date: Jul. 14, 2017

(87) PCT Pub. No.: WO2016/114791
PCT Pub. Date: Jul. 21, 2016

(65) Prior Publication Data
US 2017/0371385 A1 Dec. 28, 2017

(51) Int. Cl.
*H05K 7/20* (2006.01)
*G06F 1/20* (2006.01)
(Continued)

(52) U.S. Cl.
CPC ............... *G06F 1/20* (2013.01); *G02B 6/36* (2013.01); *G02B 6/4459* (2013.01); *G02B 6/46* (2013.01);
(Continued)

(58) Field of Classification Search
CPC ............ H05K 7/20745; H05K 7/1497; H05K 7/20836; H05K 7/20736; H05K 7/20754;
(Continued)

(56) References Cited

U.S. PATENT DOCUMENTS 3,956,673 A 5/1976 Seid
4,151,580 A 4/1979 Bremenour et al.
(Continued)

FOREIGN PATENT DOCUMENTS

CA 2531936 A1 6/2006
CN 1458559 A 11/2003
(Continued)

OTHER PUBLICATIONS

PCT/ISA/KR, International Search Report and Written Opinion, dated Oct. 16, 2015, PCT/US2015/011763, 12 pages.
(Continued)

*Primary Examiner* — Mandeep S Buttar
(74) *Attorney, Agent, or Firm* — Hewlett Packard Enterprise Patent Department

(57) ABSTRACT

Examples herein disclose a plenum. The plenum includes an enclosed structure to deliver cool air to multiple enclosures within a rack and multiple cables to route to the multiple enclosures within the rack. The plenum further includes a connector to attach the multiple cables in the plenum to one of the multiple enclosures.

18 Claims, 7 Drawing Sheets

(51) Int. Cl.
*H05K 7/14* (2006.01)
*G02B 6/36* (2006.01)
*G02B 6/44* (2006.01)
*G02B 6/46* (2006.01)
*G06F 1/18* (2006.01)

(52) U.S. Cl.
CPC .......... *G06F 1/183* (2013.01); *H05K 7/1491* (2013.01); *H05K 7/20736* (2013.01)

(58) Field of Classification Search
CPC .. H05K 7/20709; H05K 7/1488; H05K 7/202; H05K 7/1492; H05K 7/20145; H05K 7/20727; H05K 7/18; H05K 7/20136; H05K 7/1489; H05K 7/1491; H05K 7/183; H05K 7/20572; H05K 7/20609; H05K 7/20781; H05K 7/023; H05K 7/1485; H05K 7/1487; H05K 7/20209; G06F 1/20; G06F 1/206; G06F 2200/201
USPC ............ 454/184, 229, 258, 259.2; 62/259.2; 361/679.46, 695, 679.49, 691, 679.02, 361/690, 694; 165/104.33
See application file for complete search history.

(56) References Cited

U.S. PATENT DOCUMENTS

| | | | |
|---|---|---|---|
| 4,699,455 | A | 10/1987 | Erbe et al. |
| 5,216,579 | A | 6/1993 | Basara |
| 5,673,175 | A | 9/1997 | Carney et al. |
| 5,946,440 | A | 8/1999 | Puetz |
| 6,138,839 | A | 10/2000 | Cranston, III et al. |
| 6,462,944 | B1 | 10/2002 | Lin |
| 6,525,935 | B2 | 2/2003 | Casebolt |
| 6,525,936 | B2 | 2/2003 | Heitelmal et al. |
| 6,628,520 | B2 | 9/2003 | Patel et al. |
| 6,876,549 | B2 | 4/2005 | Beitelmal et al. |
| 6,882,531 | B2 | 4/2005 | Modica |
| 6,885,551 | B2 | 4/2005 | Chen |
| 6,904,968 | B2 | 6/2005 | Beitelmal et al. |
| 6,916,190 | B2 | 7/2005 | Joist |
| 7,023,708 | B2 | 4/2006 | Nguyen et al. |
| 7,031,154 | B2 * | 4/2006 | Bash ................ H05K 7/20718 165/80.3 |
| 7,226,353 | B2 | 6/2007 | Bettridge et al. |
| 7,295,444 | B1 | 11/2007 | Wang |
| 7,324,336 | B2 | 1/2008 | Vos et al. |
| 7,434,412 | B1 | 10/2008 | Miyahira |
| 7,552,758 | B2 | 6/2009 | Garner et al. |
| 7,643,291 | B2 | 1/2010 | Mallia |
| 7,646,603 | B2 | 1/2010 | Bard et al. |
| 7,660,116 | B2 | 2/2010 | Classen et al. |
| 7,735,261 | B2 | 6/2010 | Sellati |
| 7,916,476 | B2 | 3/2011 | Hsu |
| 7,952,883 | B2 | 5/2011 | Hidaka |
| 8,031,468 | B2 | 10/2011 | Bean, Jr. et al. |
| 8,218,308 | B2 | 7/2012 | Yang |
| 8,408,356 | B2 | 4/2013 | Yamaguchi et al. |
| 8,824,143 | B2 | 9/2014 | Campbell |
| 9,578,786 | B1 * | 2/2017 | Beall ................ H05K 7/20754 |
| 9,715,075 | B2 | 7/2017 | Solheid et al. |
| 2002/0007643 | A1 | 1/2002 | Spinazzola et al. |
| 2002/0032883 | A1 * | 3/2002 | Kampe ............ G06F 11/1464 714/16 |
| 2003/0150231 | A1 | 8/2003 | Spinazzola et al. |
| 2003/0222034 | A1 | 12/2003 | Champion et al. |
| 2005/0153649 | A1 | 7/2005 | Bettridge et al. |
| 2005/0168945 | A1 * | 8/2005 | Coglitore ........... H05K 7/20736 361/695 |
| 2005/0280986 | A1 * | 12/2005 | Coglitore ................ G06F 1/20 361/679.49 |
| 2006/0141921 | A1 | 6/2006 | Turek et al. |
| 2006/0215373 | A1 | 9/2006 | Joist et al. |
| 2006/0276121 | A1 * | 12/2006 | Rasmussen ........ H05K 7/20572 454/184 |
| 2008/0164794 | A1 * | 7/2008 | Lai ...................... H05K 7/1488 312/298 |
| 2008/0239659 | A1 | 10/2008 | Kundapur |
| 2008/0257639 | A1 * | 10/2008 | Yamaguchi ........ H05K 7/20736 181/198 |
| 2009/0034227 | A1 | 2/2009 | Mayer |
| 2009/0056910 | A1 | 3/2009 | Mallia et al. |
| 2009/0097204 | A1 | 4/2009 | Byers |
| 2009/0205416 | A1 * | 8/2009 | Campbell ................. G01F 1/34 73/202.5 |
| 2009/0262501 | A1 | 10/2009 | Claassen et al. |
| 2010/0085707 | A1 * | 4/2010 | Moss ................... F24F 11/0001 361/695 |
| 2011/0069450 | A1 | 3/2011 | Adducci et al. |
| 2011/0103009 | A1 | 5/2011 | Julien-Roux et al. |
| 2011/0128699 | A1 | 6/2011 | Heydari et al. |
| 2011/0228471 | A1 * | 9/2011 | Humphrey ............ F04D 27/004 361/679.48 |
| 2011/0235272 | A1 * | 9/2011 | Bash .................. H05K 7/20609 361/692 |
| 2011/0267775 | A1 | 11/2011 | VanDerVeen et al. |
| 2011/0288664 | A1 | 11/2011 | Archibald et al. |
| 2011/0291852 | A1 | 12/2011 | Forristal et al. |
| 2012/0050981 | A1 | 3/2012 | Xu et al. |
| 2012/0126069 | A1 | 5/2012 | Kucer et al. |
| 2012/0134678 | A1 * | 5/2012 | Roesner .................. G06F 13/14 398/115 |
| 2012/0140403 | A1 | 6/2012 | Lau et al. |
| 2013/0077223 | A1 * | 3/2013 | Xu ............................ G06F 1/20 361/679.4 |
| 2013/0176678 | A1 * | 7/2013 | Campbell .......... H05K 7/20745 361/679.46 |
| 2013/0242504 | A1 * | 9/2013 | Cartes ................. G05D 23/1931 361/679.49 |
| 2014/0233183 | A1 * | 8/2014 | Horng ..................... G06F 1/203 361/692 |
| 2015/0139223 | A1 * | 5/2015 | Mayenburg .......... H05K 5/0213 370/357 |

FOREIGN PATENT DOCUMENTS

| | | |
|---|---|---|
| CN | 1806477 A | 7/2006 |
| CN | 1947481 A | 4/2007 |
| CN | 101385407 | 3/2009 |
| CN | 101661417 A | 3/2010 |
| CN | 101801165 B | 8/2010 |
| CN | 102999088 | 3/2013 |
| JP | 2007324427 | 12/2007 |
| KR | 10-2012-0072880 | 7/2012 |
| WO | WO-2009114002 | 9/2009 |
| WO | WO-2010/040868 A1 | 4/2010 |
| WO | WO-2013154548 | 10/2013 |

OTHER PUBLICATIONS

PCT/ISA/KR, International Search Report and Written Opinion, dated Apr. 21, 2014, PCT/US2013/051501, 10 pages.

PCT/ISA/KR, International Search Report dated Apr. 30, 2013, PCT/US2012/057815, 9 pages.

* cited by examiner

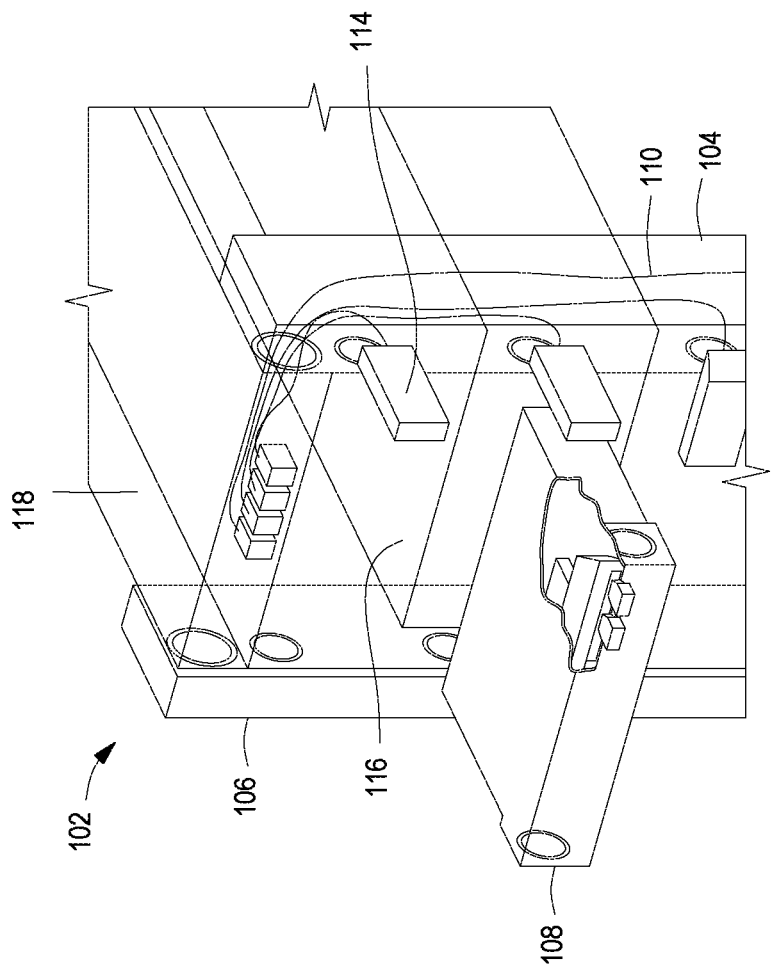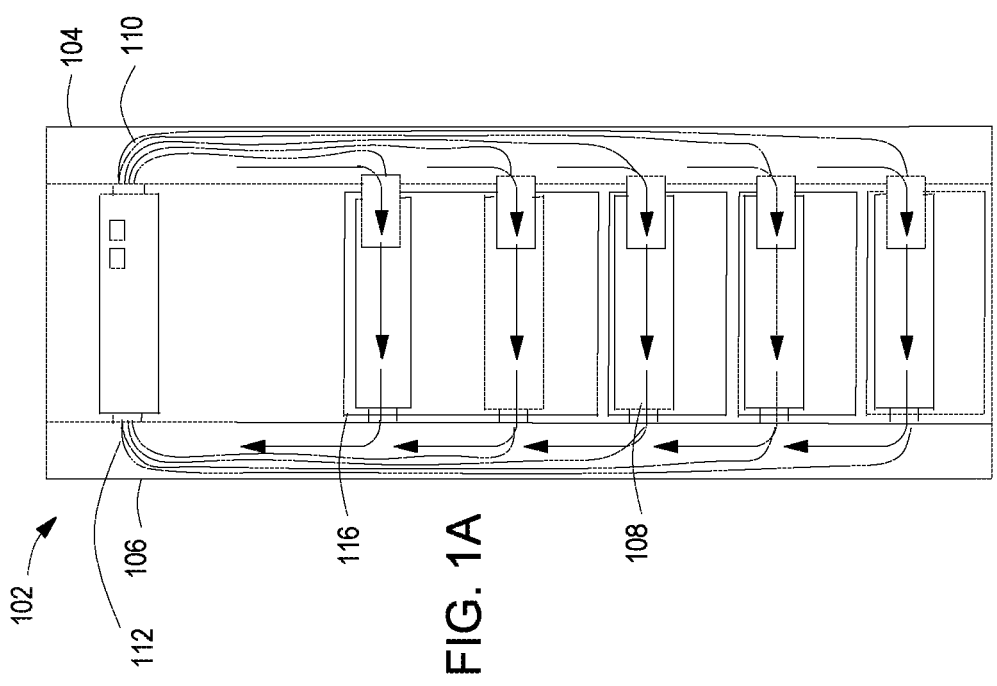

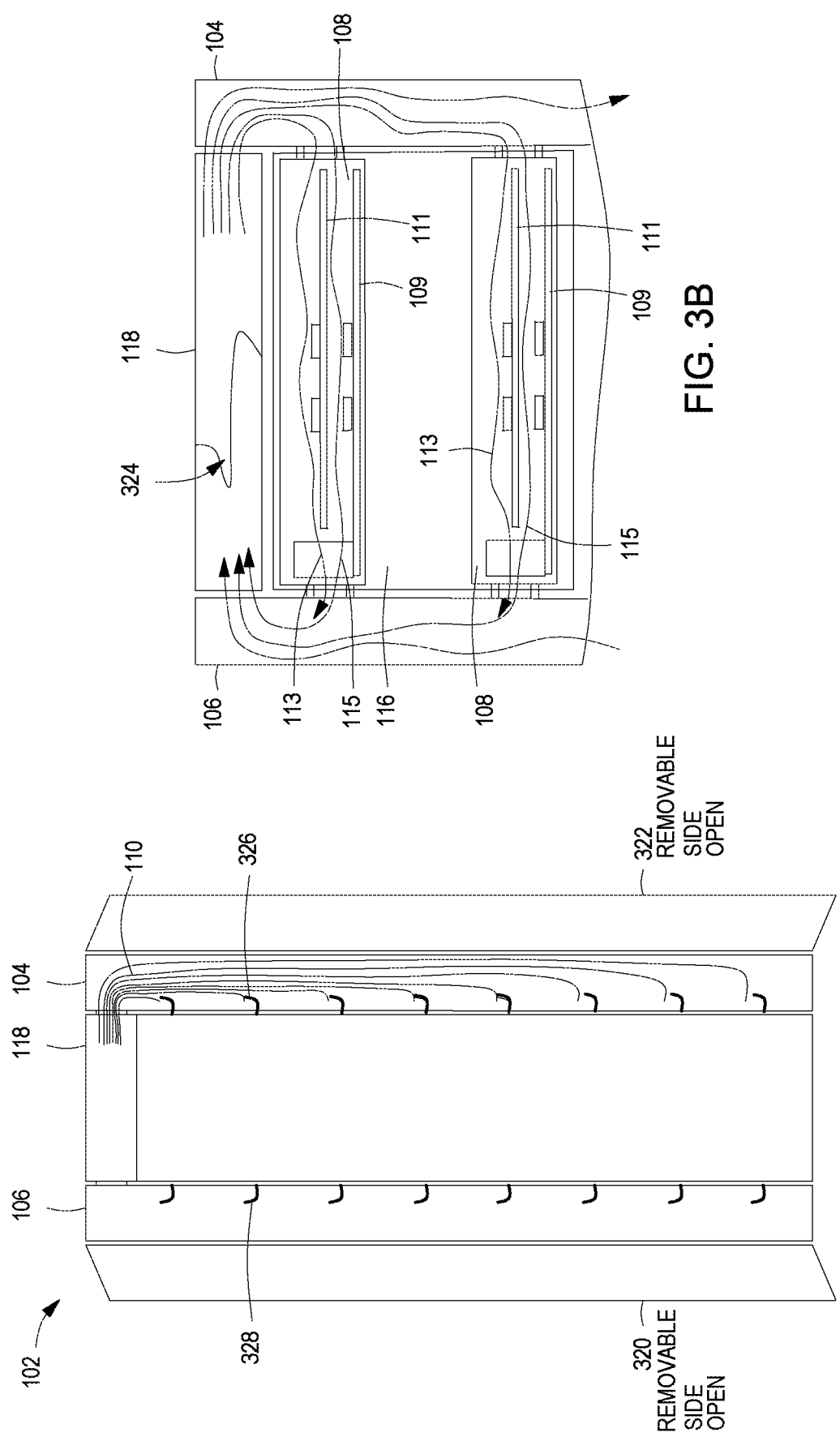

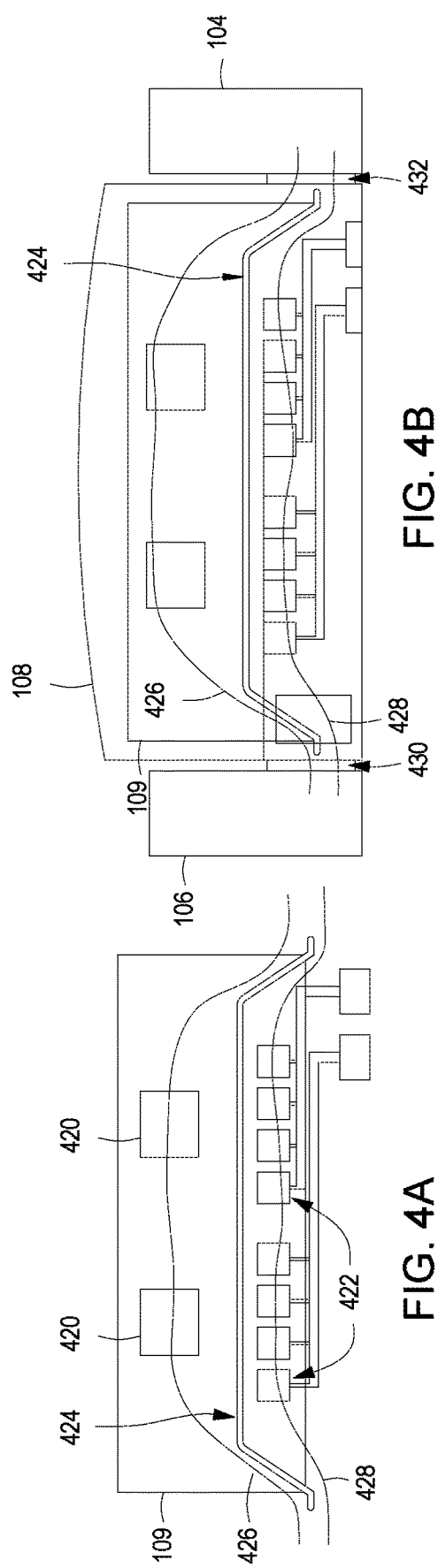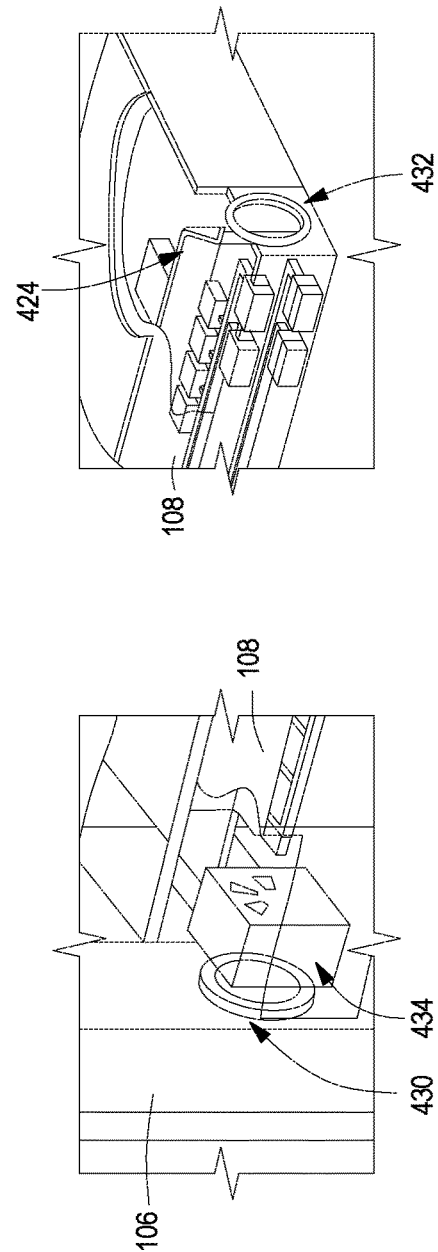

PLENUM TO DELIVER COOL AIR AND ROUTE MULTIPLE CABLES

BACKGROUND

Data centers may be used to house computer systems and associated components, such as servers and switch modules. The switch modules may be located near a rear compartment of a server enclosure where the least amount of cooling may be available. Additionally, the switch modules have increased in power consumption as the performance of these switches have increased. Thus, the potential for overheating of these switches has increased.

BRIEF DESCRIPTION OF THE DRAWINGS

In the accompanying drawings, like numerals refer to like components or blocks. The following detailed description references the drawings, wherein:

FIG. 1A is a diagram of an example infrastructure to provide airflow management and cable management to multiple enclosures within a rack;

FIG. 1B is a diagram of an example infrastructure from a top view including an air handler module, a first plenum, and a second plenum;

FIG. 3A is a diagram of an example infrastructure including a first plenum and a second plenum, each with a removable side to access multiple cables within each plenum;

FIG. 3B is a diagram of an example enclosure including multiple switch modules which receive cool air from a first plenum and exhaust heated air through a second plenum;

FIG. 4A is a diagram of an example switch module illustrating a flow of cool air from a first plenum to egressing heated air to a second plenum;

FIG. 4B is a diagram of an example switch module illustrating a flow of cool air from a first plenum to egressing heated air to a second plenum;

FIG. 4C is a diagram of an example switch module including a fan to direct heated air into a second plenum;

FIG. 4D is a diagram of an example switch module including an air baffle to direct cold air from a first plenum;

DETAILED DESCRIPTION

Figure 2:
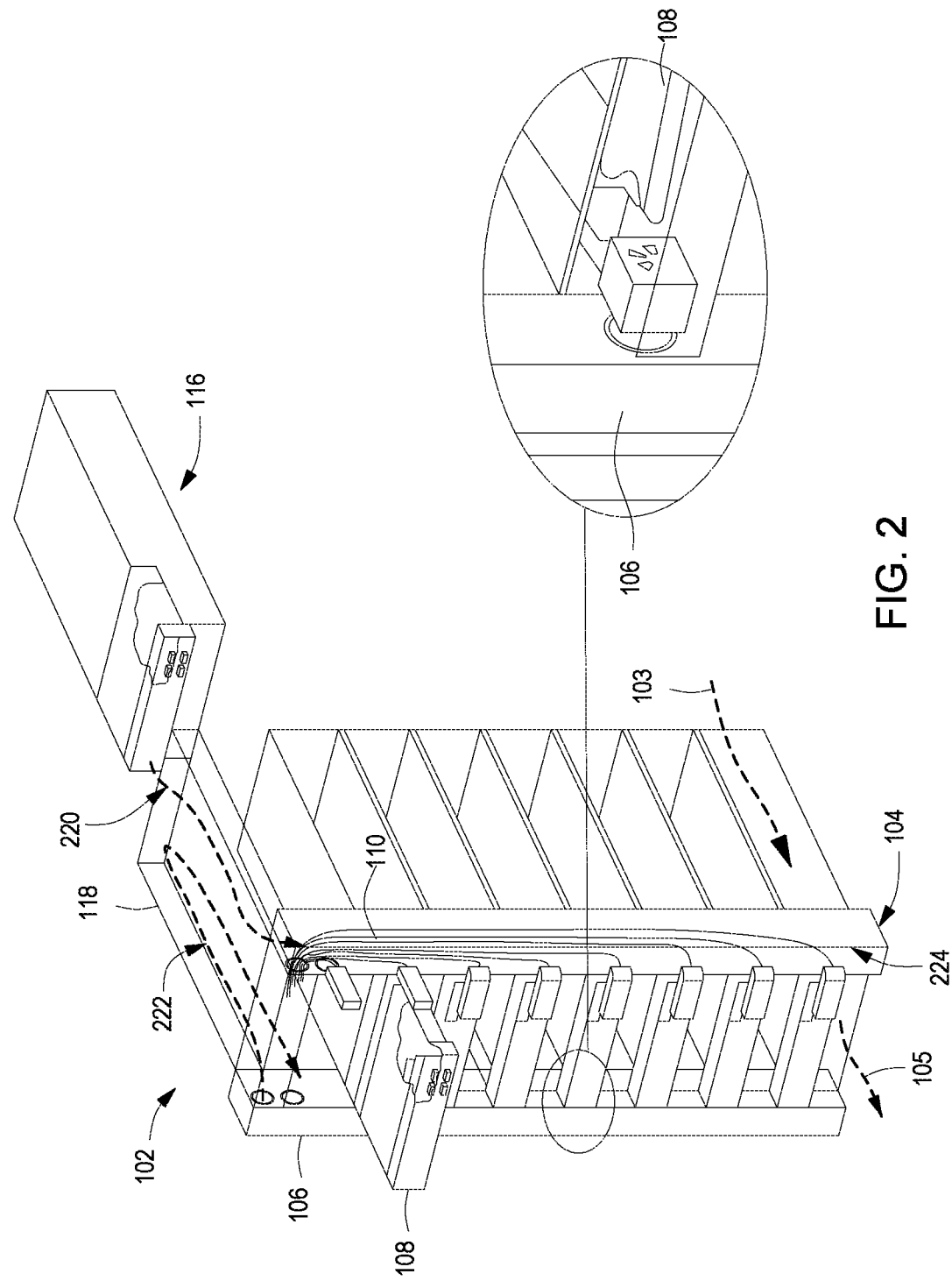
FIG. 2 is a diagram of an example infrastructure including a first plenum, a second plenum, and an air handler module in which to route cables and deliver a cool airflow to multiple switch modules within multiple enclosures.

Servers may be located near front compartments and switch modules may be located near rear compartments of a server enclosure, where the least amount of cool air may be available in a front-to-rear forced air cooled enclosure. The server enclosures or the data centers housing these server enclosures may be redesigned to efficiently cool the switch modules, but this may take much time, effort, and resources to conform to the redesigns. Cool airflow may be pulled in through a front-facing faceplate of the server enclosure by the enclosure fans located in the rear compartments. However, these enclosure fans may be situated in parallel to the switch modules where loop-cooling methods have been resorted to recirculate the heated air from the outside and rear of the enclosure. Servers typically have high-power processors and memory components, and other components situated downstream to these high-power components will be exposed to already heated air. Additionally, cable connectivity to the rear-facing faceplate of the switch modules may impede the airflow. For example, to cool switch modules housed in the server enclosure, cables may be organized tightly to prevent interference of hot air to be exhausted through the faceplates of the switch modules. This may become cumbersome to service the cables attached to the switch modules. Further, the switch modules may include a thermally-sensitive optical transceiver which may reduce reliability of a system upon overheating of the optical transceiver.

To address these issues, examples disclose a cooling infrastructure with cable management to efficiently cool switch modules in multiple enclosures within a rack. The cooling infrastructure includes a first plenum coupled to a port for delivering cool air through a switch module within an enclosure. The switch module receives the cool air on the side, through the port thus preventing interference of cables on a faceplate of the switch module for cooling purposes. Additionally, the first plenum routes multiple cables to multiple switch modules. The first plenum routes the multiple cables to the faceplate of each switch module, thus providing the cable management. In this manner, although the cooling airflow and the multiple cables are routed through the first plenum, the airflow and multiple cables are delivered to the multiple switch modules in different locations on each switch module. For example, the cooling airflow is provided through the side of the switch module while the multiple cables are coupled to the faceplate of the switch module. This allows the first plenum to provide both the cable management and cooling airflow to each of the switch modules. In addition, the multiple cables can be minimally jacketed since they are protected within the first plenum, requiring less volumetric for the multiple cables which in turn allows minimum interference to the cool air flow through the first plenum and easy to service the multiple cables on the faceplates of the switch modules. Further, the cool air can efficiently flow through the switch modules because the cool air flow through the sides of the switch modules is not in the same path as the multiples cables connected to the faceplates of the switch modules.

The infrastructure further includes a second plenum in which to receive heated air from each of the switch modules and to route additional multiple cables from each of the switch modules. Including the first plenum to deliver cool air to the switching modules and the second plenum to receive the heated air from the switch modules provides a semi-closed loop type of cooling system thus producing an independent cooling path from the front-to-back forced air cooling for the servers through the enclosures.

In another example discussed herein, the first plenum and the second plenum include sensors which measures temperatures and rates of airflow of both the cool air and the heated air. These measurements may be signaled to an air handler module which may adjust the rate of the cooling air delivered into the first plenum, and the rate of the heated air extracted from the second plenum. This example enables the air handler module to make adjustments to efficiently cool the switch modules. Further, multiple cables from the first plenum and the second plenum may be routed to the air handler module through the cable ports on the sides of the air handler, and these multiple cables may be disposed on the rear faceplate of the air handler for corresponding multiple cables to be connected.

Thus, examples disclose an infrastructure to provide both a cable management and cooling system to multiple enclosures in a rack.

Referring now to the figures, FIG. 1A is a diagram of an example infrastructure 102 to provide airflow management and cable management to multiple enclosures 116 within a rack. The infrastructure 102 includes a first plenum 104 to deliver cool air and to route multiple cables 110 to switch modules 108 within the multiple enclosures 116. The infrastructure 102 also includes a second plenum 106 to route multiple cables 112 from each of the switch modules 108 within the multiple enclosures 116. Upon the first plenum 104 delivering the cool air to the switch modules 108 within the multiple enclosures 116, the second plenum 106 receives the heated air from the multiple enclosures 116. The heated air is produced upon the first plenum 104 directing the cool air to each of the multiple enclosures 116. Thus, upon each of the multiple enclosures 116 receiving the cool air through the first plenum 104, this cool air may increase in temperature due to the cooling of the components, such as electrical and/or optical components in the switch module 108. This produces the heated air which egresses each of the multiple enclosures 116 into the second plenum 106. FIG. 1A shows a modularly installable and serviceable cooling infrastructure 102 with a cooling air plenum (i.e., the first air plenum 104) and a heated air plenum (i.e., the second air plenum 106) which are considered independent of the cooling systems and/or fans located within the multiple enclosures 116.

The first plenum 104 routes the multiple cables 110 to each of the switch modules 108 within the multiple enclosures 116 of the rack. The first plenum 104 is a mechanical structured channel of at least four sides or walls in which makes up a conduit to encase the multiple cables 110 and deliver cool air to the switch modules 108. The multiple cables 110 are routed to each of the switch modules 108 from other networking components within the rack and/or from other racks. Providing the routes between the switch modules 108 and other networking components provides the path as a means for forwarding networking traffic and/or signals between each of the multiple enclosures 116 and other networking components. In an implementation, the first plenum 104 may further include multiple sensors, multiple partitions and multiple louvers. The multiple sensors may be used to measure the temperature and/or airflow of the cool air. The multiple partitions and louvers may be used to distribute the cool airflow throughout the first plenum 104. The multiple cables may be managed in the same or different multiple partitions as the airflow of the cool air. In another implementation, the first plenum 104 and/or the second plenum 106 include a removable wall or side which may be used to access the multiple cables 110 and/or 112 within their respective plenum 104 and 106. These implementations are discussed in detail in later figures.

The second air plenum 106 routes the multiple cables 112 from each of the switch modules 108 to other networking components. Additionally, the second air plenum 106 may receive the heated air from the switch modules 108. The first air plenum 104 may direct the cool air to the air handler module (illustrated in FIG. 1B) which in turn ingresses this cool air from the front of the rack 103. The second air plenum 106 may direct the heated air up to the air handler module 118 which in turn egresses this heated air towards the rear of the rack 105. In this manner, the airflow encompasses a semi-closed loop type system to cool the components within the switch modules 108. The second air plenum 106, similar to the first air plenum 104, is a mechanical structure of at least four sides or walls in which makes up a conduit or channel to encase the multiple cables 112 and the heated air for delivery to the air handler module.

The switch modules 108 are computer networking devices located within each of the multiple enclosures 116. As such, the switch modules 108 operate to connect devices together on a computer network, by using a form of packet switching to forward data to the destination device. The switch modules 108 include electrical components, such as integrated circuits, application specific integrated circuits (ASICs), and/or optical transceivers to connect to other switch modules 108 within the rack and/or other racks. In one implementation, each of the multiple enclosures 116 include two or more switch modules 108.

The multiple cables 110 and 112 are routed through each plenum 104 and 106, respectively. In one implementation, the multiple cables 110 and 112 include optical cables which are routed from the air handler module through the first plenum 104 to each switch module 108. From each switch module 108 the multiple cables 112 are routed through the second plenum 106 and to the air handler module faceplate. In another implementation, the plenums 104 and 106 include a separate partition as the cool air, such as a conduit, in which to route the multiple cables 110 and 112 to and from the multiple switch modules 108.

FIG. 1B is a diagram of an example infrastructure 102 from an angled top view. The infrastructure 102 includes a first plenum 104, a second plenum 106, and an air handler module 118. In this illustration, the infrastructure 102 is a modularly installable cooling infrastructure with plenums, independent from the cooling infrastructure of the enclosure 116. These independent plenums may include a cooling air plenum (e.g., first plenum 104) and a heated air plenum (e.g., second plenum 106). In an example, the air handler module 118 is installable from a front of the rack as illustrated in FIG. 1B. The air handler module 118 may include redundant power supplies and fans in which to provide a source of the cool air through the first plenum 104. Although figures throughout this application depict the air handler module 118 pulling cool air from the front of the rack through its faceplate, implementations should not be limited. For example, the air handler 118 may generate cool air, in addition to or instead of pulling cool air from the front of the rack through its faceplate. In another implementation, the air handler module 118 routes the cables through the first plenum 104 to each of the multiple enclosures 116. In a further implementation, the first plenum 104 and the second plenum 106 may include multiple sensors indicating a temperature and/or rate of the airflow in each respective plenum. As such, the air handler module 118 may take action to adjust the temperature and/or rate of the airflow. Although FIGS. 1A and 1B illustrate the infrastructure 102 as including a single first plenum 104 as the cooling air plenum and a single plenum 106 as the heated air plenum, implementations should not be limited as the infrastructure may include multiple cooling air plenums and multiple heated air plenums.

FIG. 2 is a diagram of an example infrastructure 102 which routes multiple cables and delivers a cool airflow to multiple switch modules 108 within multiple enclosures 116. The infrastructure 102 includes an air handler module 118, a first plenum 104 to deliver cool air and route cables to the multiple switch modules 108, an optical infrastructure 224 located as a partition within the first plenum 104, and a second plenum 106 to receive heated air and to route multiple cables from the switch modules 108. Each of the switch modules 108 are located within the multiple enclosures 116 as part of the rack. As such, the multiple enclosures 116 are considered blade enclosures to house blade servers for operation in a networking system. The switch modules 108 provide the switching functionality to each of the blade servers. In one implementation, when one of the multiple enclosures 116 is removed from the rack, a corresponding cold air port and a corresponding hot air port are closed so that the cool air may be delivered to the other multiple enclosures 116 within the rack. In this implementation, when one of the multiple enclosures 116 are installed within the rack, the corresponding cold air port and corresponding hot air port are opened to provide a cool air flow to and exhaust a heated airflow from the switch module 108 within the installed enclosures 116. In a further implementation, each of the multiple enclosures 116 include a connector which may optically couple to the optical infrastructure 224. The optical infrastructure 224 is the infrastructure which encases and routes the multiple cables to the switch modules 108. In this implementation, the multiple cables (not illustrated) are optical cables which are routed to each switch module 108 by way of the optical infrastructure 224. The optical infrastructure 224 may be located internally to the first plenum 104 for routing the multiple cables. As such, the optical infrastructure 224 is considered a mechanical-structured channel, such as a conduit, for housing the multiple cables for delivery to the switch modules 108 and may include a fiber cable harness. In another implementation, the second plenum 106 includes a different optical infrastructure (not illustrated) in which to route each of the multiple cables (not illustrated) from the switch modules 108. These implementations are discussed and illustrated in detail in later figures.

The air handler module 118 pulls cold air 220 from a front of the rack and delivers this air 220 as the cool air into the first plenum 104 for delivery to the switch modules 108. The air handler module 118 pulls heated air 222 from the second plenum 106 and exhausts the heated air 222 toward the rear of the rack. In this manner, the cold air 220 is pressurized in the first plenum 104 and distributed to the switch modules 108 while the heated air 222 is pulled from the infrastructure 102 via the second air plenum 106. In another implementation, a fan may be located within each switch module 108 to assist the heated air within each switch module 108 to be directed to the second plenum 106. Additionally, the fan may also be used to prevent the heated air within the second plenum 106 to flow into a corresponding switch module 108.

The cold air intake at the front of the rack and the heated air exhaustion 222 at the rear of the rack, are considered independent of a cooling system infrastructure within each of the multiple enclosures 116. For example, the cooling system infrastructure in place for each of the multiple enclosures 116 may pull in cool air from the front of each enclosure 103 and exhaust air to the rear 105 of each enclosure. In this implementation, airflow management implemented by infrastructure 102 through each of the plenums 104 and 106 serves as an independent and a supplemental cooling system for the rack.

FIG. 3A is a diagram of an example infrastructure 102 without multiple enclosures and/or multiple switch modules. Accordingly, the infrastructure 102 includes an air handler module 118, a first plenum 104 with a removable side 320, and a second plenum 106 with a removable side 322. These sides 320 and 322 may be removable from the respective plenum 104 and 106 in the sense these sides 320 and 322 open to provide access to the multiple cables within each plenum 104 and 106. In this manner, the removable side may uncouple from one of the adjacent walls. In another example, these sides 320 and 322 may include hinges to allow these sides to be opened to reveal the multiple cables.

Each plenum 104 and 106 further includes multiple louvers 326 and 328, respectively, to apportion air delivery and air reception to and from the switch modules. The multiple louvers 326 in the first plenum 104 are horizontal slates which are angled in such a manner as to admit cool air into each of the switch modules. Admitting the cool air from the first plenum 104 into each of the switch modules ensures the switch modules located near the bottom (or furthest from the source of cool air) receives a distribution of the cool air as the switch modules located closest to the source of the cool air. In this example, the air handler module 118 may provide the source of the cool air by creating an intake of the cool air into the switch modules. The multiple louvers 328 in the second plenum 106 are horizontal slates which are angled in such a manner which allows the reception of the heated air from the switch modules. These multiple louvers 328 direct air from the switch module back up through the air handler module 118 to expel the heated air. Additionally, the multiple louvers 328 located in the second plenum 106 minimize the heated air flow back into an adjacent switch module. In implementations, the multiple louvers 326 and 328 may include knobs, levels, or other manual or automated control mechanism located on each respective plenum 104 and 106 to adjust the multiple louver angles independently for optimizing air flow for each of the multiple enclosures as an enclosure position along the rack height may affect an amount of the airflow delivered. For example, an enclosure closest to the source of cool air may receive a larger amount of airflow than an enclosure furthers from the source of the cool air. Additional partitions (not shown) may be constructed in the first and the second plenums 106 and 108 to optimize air flow respectively through the first and second plenums 106 and 108.

FIG. 3B is an illustration of an example enclosure 116 including multiple switch modules 108. Each of the multiple switch modules 108 receive cool air from a first plenum 104 and exhaust heated air through a second plenum 106. Additionally, multiple cables (not illustrated) are routed to and from each of the switch modules 108 in the enclosure 116 through the plenums 104 and 106. Above the enclosure 116, an air handler module 118 includes an air baffle 324 which divides airflow in the air handler module 118 into the cool air intake for the first plenum 104 and expels the heated air from the second plenum 106 through a front of the air handler module 118. In this implementation, the air handler module 118 intakes cold air from the front of the rack (not illustrated) of the air handler module 118 and exhausts the heated air to the rear of the rack (not illustrated). As such, the air baffle 324 operates to provide a separation between the cold airflow intake and the exhausted heated air within the air handler module 118 to efficiently deliver cool air to and extract heated air from the multiple switch modules 108. FIG. 3B also illustrate air flow paths 113 and 115 to cool the components on the multiple switch printed circuit assemblies (PCA) 109 and 111 in each of the multiple enclosures.

FIG. 4A is a diagram of an example switch PCA 109 in a switch module (illustrated in FIG. 4B) including an air baffle 424 to divide a flow of cool air from a first plenum into a first airflow 426 and a second airflow 428. In implementations, the air baffle 424 consists of a thermal-isolation material allowing the air baffle 424 to divide the cool air from the first plenum into the first airflow 426 and the second airflow 428. The air baffle 424 directs the first airflow 426 over multiple integrated circuits 420 and the second airflow 428 over multiple optical transceivers 422. In this implementation, the air baffle 424 within the switch module 108 diverts an appropriate amount of cool air from the first plenum 104 to cool the multiple integrated circuits 420 and the multiple optical transceivers 422 separately. Upon the air baffle 424 directing the air flow over the multiple integrated circuits 420 and the multiple optical transceivers 422, the airflows 426 and 428 increase in temperature resulting in heated air to the second plenum.

FIG. 4B is a diagram of an example switch module 108 illustrating a cool airflow from a first plenum 104 as through a cold air port 432. Upon entering through the cold air port 432, the cool airflow is divided into a first airflow 426 and a second airflow 428 based on the air baffle 424. Upon moving across the heated components within the switch module 108, the airflows 426 and 428 egress through a hot air port 430 into a second plenum 106. As such, the airflows 426 and 428 move across the switch module 108 to cool the components including integrated circuits and optical transceivers, thus producing heated air. The heated air is egressed from the switch module 108 through the hot air port 430 into the second plenum 106. Although FIG. 4A illustrates the airflows 426 and 428 to and from the first plenum 104 and the second plenum 106, implementations should not be limited as the plenums 426 and 428 further include multiple cables routed to and routed from the switch module 108.

FIG. 4C is a diagram of an example switch module 108 including a fan 434 to direct heated air through a hot air port 430 into a second plenum 106. The fan 434 forces the heated air from the airflows illustrated in FIGS. 4A-4B into the second plenum 106 to egress the heated air into the second plenum 106. Additionally, the second plenum 106 may include multiple cables (not illustrated) routed from the switch module 108.

FIG. 4D is a diagram of an example switch module 108 including an air baffle 424 to divide cool air as delivered from a first plenum (not shown) through a cold air port 432. FIG. 4D illustrates the air baffle 424 to apportion the cool air flow from the first plenum to direct a first airflow of cool air and a second flow of cool air over integrated circuits and optical transceivers as illustrated in FIGS. 4A-4B.

Figure 5:
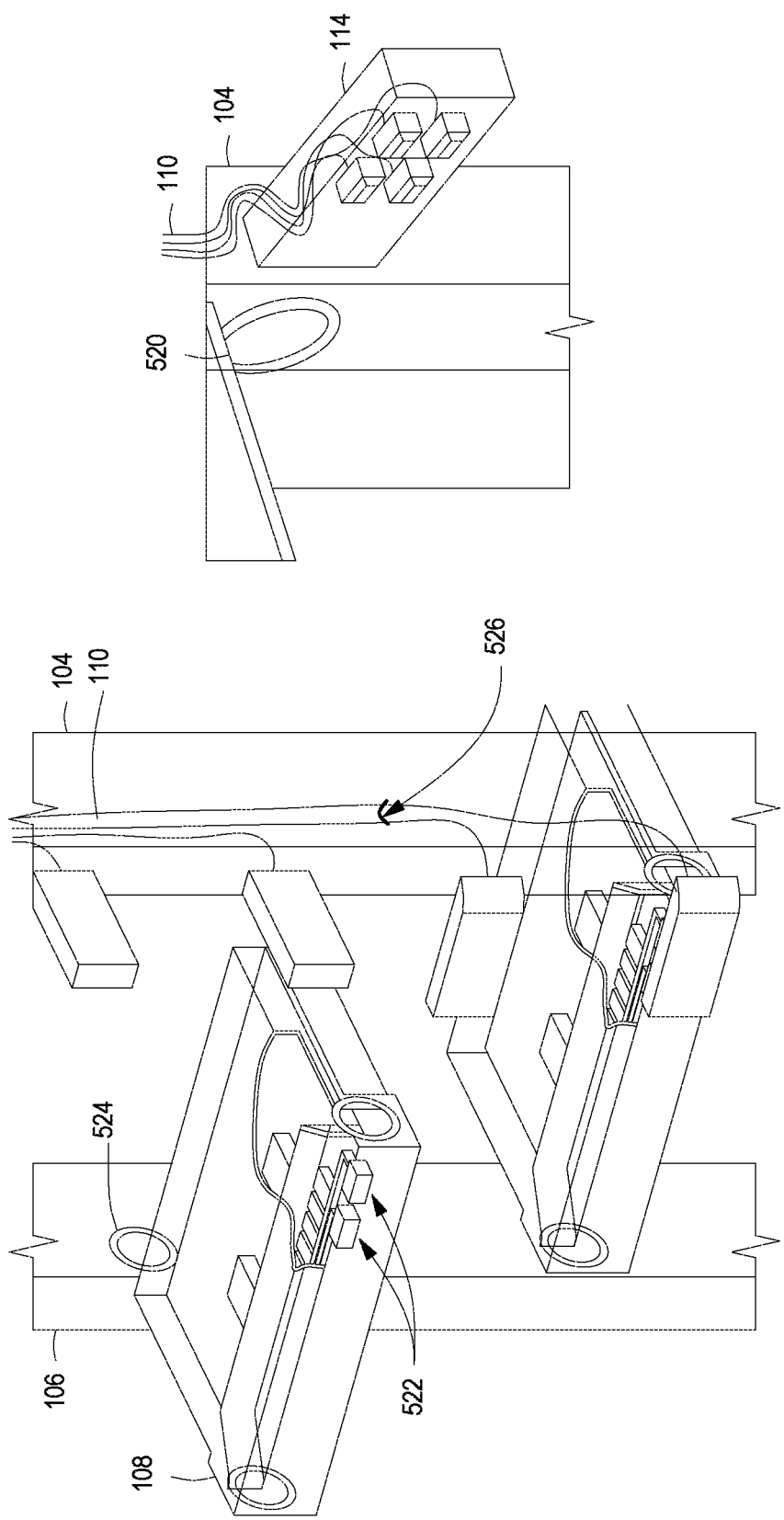
FIG. 5 is a diagram of an example infrastructure to route cables to multiple enclosures in a rack through multiple connectors.

FIG. 5 is a diagram of an example infrastructure from an angled side perspective. The infrastructure includes a first plenum 104 and a second plenum 106. The first plenum 104 routes multiple cables 110 to each multiple enclosures within a rack. Specifically, the multiple cables 110 are routed to connect to each switch module 108 within the multiple enclosures. Additionally, the first plenum 104 includes multiple connector assemblies 114 for connecting the multiple cables 110 through connectors 522 on a face plate of the switch module 108. The first plenum 104 further includes a cold air port 520 in which cold air (not illustrated) is delivered to the switch module 108 via corresponding cold air port 432 (as shown in FIGS. 4B and 4D) of the switch module 108 in each of the multiple enclosures.

The second plenum 106 includes multiple cables (not illustrated) which are routed from each of the switch modules 108. Additionally, the second plenum 106 includes a hot air port 524 which enables heated air (not illustrated) to escape from the switch module 108 via corresponding hot air port 430 (as shown in FIGS. 4B and 4C) of the switch module 108.

FIG. 5 illustrates the infrastructure in which the first plenum 104 includes a fiber harness 526 in the first plenum 104 and the connector assembly 114. The multiple cables 110 are terminated on each connector assembly 114 and may be implemented as a blind mate connector assembly. In this implementation, each connector assembly 114 serves as the blind mate connector in the sense that the mating action of each connector assembly 114 occurs through aligning the connector assembly 114 to the connectors 522 on the face plate of the switch module 108. The alignment may occur through snapping, sliding, or otherwise bringing together the connector assembly 114 to the faceplate connector 522. In another implementation, the multiple cables 110 may be manually coupled to the connectors 522 on the switch module 108 faceplate. The multiple connectors on a connector assembly 114 may include smaller-adjustment features to fine tune its position to properly connect with the connectors 522 on the switch module 108. Additionally, the position of each of the multiple connector assemblies 114 may be adjustable on the first plenum 104, to allow multiple cables 110 to be coupled to switch module faceplates with different connector positions. Alternatively, the first plenum 104 may be a multi-segment assembly (not illustrated) where varying length segments may be used to change positions of each connector 114 to properly align with the corresponding switch module 108 within the enclosure.

Figure 6:
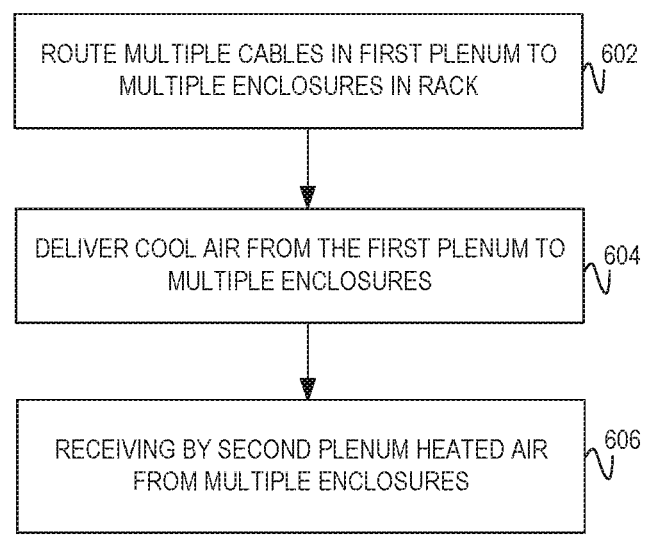
FIG. 6 is a flowchart of an example method, performed by an infrastructure, to deliver cool air from a first plenum to multiple enclosures in a rack and to route multiple cables to these multiple enclosures.

FIG. 6 is a flowchart performed by an infrastructure to deliver cool air and to route multiple cables to multiple enclosures in a rack. The infrastructure includes a first plenum in which to route multiple cables to the multiple enclosures within the rack. The first plenum delivers cool air to the multiple enclosures to prevent overheating of components. The infrastructure includes a second plenum which receives heated air from each of the multiple enclosures for egressing the heated air from each of the multiple enclosures. As such, the infrastructure provides a controlling air flow and cable management to the rack of multiple enclosures. FIG. 6 represents the example method in which the infrastructure rack may operate to regulate temperatures and route cables for functionality within the rack system. In discussing FIG. 6, references may be made to the components in FIGS. 1-5 to provide contextual examples. In one implementation, the infrastructure rack 102 as in FIGS. 1-5 includes operations 602-606 for routing cables and providing cool air to the multiple enclosures.

At operation 602, the infrastructure routes the multiple cables to each of the multiple enclosures in the rack. The multiple cables may be routed to select a path from the components within each of the multiple enclosures to other networking components. The path is selected as mean for forwarding networking traffic and/or signals from each of multiple enclosures to other networking components.

At operation 604, the infrastructure provides the cool air from the first plenum to each of the multiple enclosures. Providing the cool air prevents overheating of the components within each of the enclosures. The infrastructure may include an air handler module which provides a source of the cool air through the first plenum for delivery to each of the multiple enclosures. In another implementation, the first plenum may include a sensor for the air handler module to obtain a measurement of temperature and/or flow rate of the cool air. In this implementation, the air handler module may in turn adjust the cool air provided to the first plenum.

At operation 606, the infrastructure receives the heated air upon egress from each of multiple enclosures. The infrastructure includes the second plenum coupled to each of the multiple enclosures. Thus, upon each of the multiple enclosures receiving the cool air, the cool air may increase in temperature due to heating of components within each of the multiple enclosures, thus producing the heated air. In another implementation, the second plenum includes a sensor which signals measurements of the heated temperature to the air handler module. In a further implementation, each of the multiple enclosures include a fan to egress the heated air into the second plenum.

Figure 7:
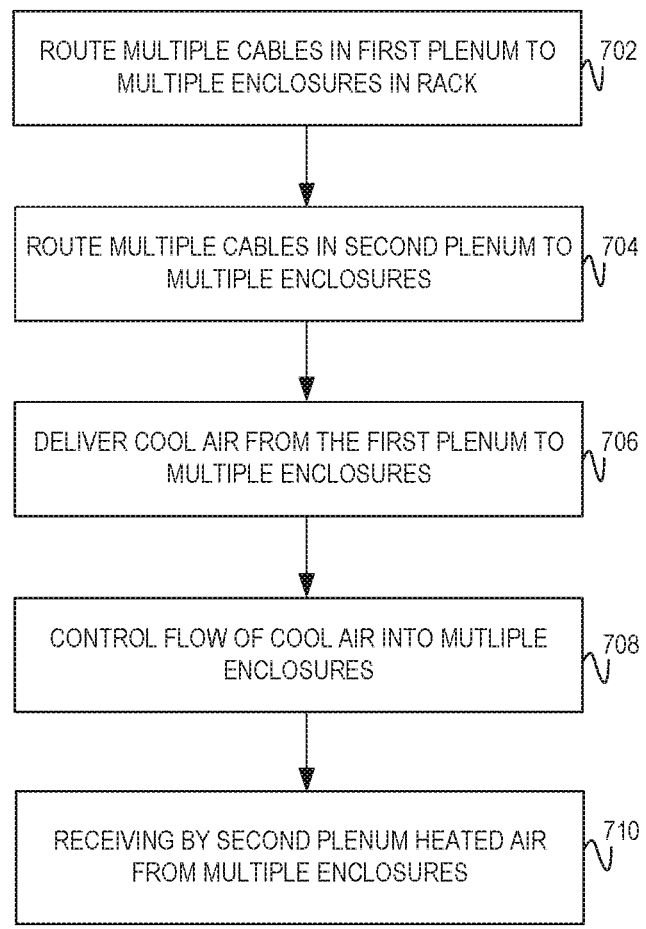
FIG. 7 is a flowchart of an example method, performed by an infrastructure, to provide cool air to multiple enclosures and receive heated air from the multiple enclosures.

FIG. 7 is a flowchart of an example method, performed by an infrastructure, to provide a cooling air system and cable management to multiple enclosures within a rack. The infrastructure includes a first plenum which routes multiple cables to multiple enclosures in the rack. The infrastructure further includes a second plenum to route the multiple cables from each of the multiple enclosures to other networking components. An air handler module may provide the source of cool air for delivery through the first plenum. The first plenum includes louvers or other air directing devices to control a flow of air into each of the multiple enclosures. This enables cool air to be distributed to each of the multiple enclosures in the rack. Upon each of the multiple enclosures receiving the cool air, the enclosure may increase the temperature of the cool air thus producing the heated air for egress to the second plenum. FIG. 7 represents the example method in which the infrastructure rack may operate to regulate temperatures and route cables for functionality within the rack system. In discussing FIG. 7, references may be made to the components in FIGS. 1-5 to provide contextual examples. In one implementation, the infrastructure rack 102 as in FIG. 1 includes operations 702-710 for routing cables and providing cool air to the multiple enclosures.

At operation 702, the infrastructure routes the multiple cables to each of the multiple enclosures. The infrastructure includes the first plenum which includes cables routed from an air handler module through the first plenum to each of the multiple enclosures. Operation 702 may be similar in functionality to operation 602 as in FIG. 6.

At operation 704, the infrastructure routes the multiple cables from each of the multiple enclosures. The infrastructure includes the second plenum which routes the multiple cables from each of the multiple enclosures to the appropriate destination, such as other networking components within the rack and/or other networking components to other racks.

At operation 706, the infrastructure delivers the cool air to each of the multiple enclosures within the rack. The first plenum which routes multiple cables may also deliver the cool air to each of the multiple enclosures. In this implementation, the air handler module provides the source of cool air through the first plenum for delivery to each of the multiple enclosures. Operation 706 may be similar in functionality to operation 604 as in FIG. 6.

At operation 708, the infrastructure controls a flow of the cool air into each of the multiple enclosures. Each plenum (i.e., the first plenum and the second plenum) may include multiple louvers to ensure the air to control the airflow accordingly. In another implementation, each plenum includes multiple sensors which measure the temperature and/or rate of airflow within each plenum. These measurements are reported to the air handler module to take appropriate action. For example, the multiple sensors may take measurements of the temperature of the cold air and the heated air, respectively. If the cold air increases in temperature, this may signal to the air handler module the source of the cold air may be failing. In another example, if the temperature of the heated air is above normal or a particular threshold, this may indicate the cool air may not be cooling the components within the enclosure.

At operation 710, the infrastructure receives the heated air from each of the multiple enclosures. Upon the first plenum delivering the cool air to each of the multiple enclosures, the second plenum receives the heated air upon egress from the multiple enclosures. Operation 710 may be similar in functionality to operation 606 as in FIG. 6.

Thus, examples disclosed herein provides a cable management and cooling system to multiple enclosures within a rack system.

We claim:

1. A rack infrastructure comprising:
a first plenum to:
route multiple cables to multiple enclosures;
deliver cool air to the multiple enclosures;
the multiple enclosures between the first plenum and a second plenum;
the second plenum to:
route multiple cables from the multiple enclosures;
egress heated air from the multiple enclosures; and
an air handler module to:
provide the cool air to the first plenum, wherein the air handler module is modularly installable into the rack infrastructure and wherein the air handler module may adjust temperature or flow rate based in part on the temperature of the first plenum and the second plenum;
route the multiple cables to the first plenum;
provide a source of the cool air to the first plenum for delivery of the cool air to the multiple enclosures;
route the multiple cables from the second plenum; and
receive the heated air from the second plenum.

2. The rack infrastructure of claim 1 wherein the first plenum comprises:
a removable side to access the multiple cables routed to the multiple enclosures; and
multiple sensors to monitor a temperature of the cool air and a flow rate of the cool air and provide the temperature of the cool air and the flow rate of the cool air to the air handler module.

3. The rack infrastructure of claim 1 wherein the second plenum comprises:
a removable side to access the multiple cables routed from the multiple enclosures; and
a sensor to monitor a temperature of the heated air from the multiple enclosures and provide the temperature of the heated air to the air handler module.

4. The rack infrastructure of claim 1 wherein each of the multiple enclosures comprise:
multiple switch modules.

5. The rack infrastructure of claim 1 wherein each of the multiple enclosures include a switch module comprising:
a baffle to:
divide a flow of the cool air from the first plenum into a first flow of cool air and a second flow of cool air; and
direct the first flow of cool air over an integrated circuit and the second flow of cool air over an optical transceiver.

6. The rack infrastructure of claim 1 wherein the first plenum and the second plenum comprise:
multiple louvers to control the cool air flow and the heated air flow between each of the multiple enclosures.

7. The rack infrastructure of claim 1 further comprising:
a port, coupled to the first plenum, to deliver the cool air to one of multiple enclosures.

8. The rack infrastructure of claim 1, wherein the air handler module is installable from a front of the rack infrastructure.

9. The rack infrastructure of claim 1, wherein the air handler module includes redundant power supplies and redundant fans.

10. The rack infrastructure of claim 1, wherein the air handler module pulls the cool air from the front of the rack infrastructure through a face plate of the air handler.

11. The rack infrastructure of claim 1, wherein the air handler module generates the cool air.

12. The rack infrastructure of claim 1, wherein the air handler module exhausts the heated air through a rear side of the rack infrastructure.

13. A plenum comprising:
an enclosed multi-segmented structure to deliver cool air to multiple enclosures within a rack;
multiple cables to route to the multiple enclosures within the rack;
an air handler to provide the cool air to the enclosed structure; and
connectors to attach the multiple cables in the plenum to one of the multiple enclosures, wherein a length of each segment of the enclosed multi-segmented structure is utilized to change positions of each connector to align each connector with a corresponding switch module within one of the multiple enclosures.

14. The plenum of claim 13 wherein the enclosed multi-segmented structure comprises a removable side to access the multiple cables.

15. The plenum of claim 13 comprising:
multiple louvers to control a flow of the cool air for delivery to each of the multiple enclosures.

16. A method comprising:
routing multiple cables in a first plenum to a plurality of switch modules, each switch module in one of multiple blade enclosures in a rack;
providing cool air from an air handler in the rack to the first plenum;
delivering cool air from the first plenum to the multiple blade enclosures in the rack;
receiving heated air from the multiple blade enclosures by a second plenum;
dividing the cool air from the first plenum into a first airflow and a second airflow;
directing the first airflow to an integrated circuit in each switch module; and
directing the second airflow to an optical transceiver in each switch module.

17. The method of claim 16 comprising:
routing multiple cables in the second plenum from the plurality of switch modules.

18. The method of claim 16 comprising:
controlling a flow of the cool air into each of the multiple blade enclosures in the rack.

* * * * *